US007078262B2

(12) United States Patent
Yamamoto et al.

(10) Patent No.: US 7,078,262 B2
(45) Date of Patent: Jul. 18, 2006

(54) SEMICONDUCTOR WAFER TRANSPORT METHOD AND SEMICONDUCTOR WAFER TRANSPORT APPARATUS USING THE SAME

(75) Inventors: Masayuki Yamamoto, Osaka (JP); Takao Matsushita, Mie (JP)

(73) Assignee: Nitto Denko Corporation, Osaka (JP)

( * ) Notice: Subject to any disclaimer, the term of this patent is extended or adjusted under 35 U.S.C. 154(b) by 98 days.

(21) Appl. No.: 10/303,816

(22) Filed: Nov. 26, 2002

(65) Prior Publication Data

US 2003/0133762 A1 Jul. 17, 2003

(30) Foreign Application Priority Data

Dec. 3, 2001 (JP) .............................. 2001-368629
Oct. 4, 2002 (JP) .............................. 2002-292568

(51) Int. Cl.
*H01L 21/50* (2006.01)
*H01L 21/31* (2006.01)
*B65H 1/00* (2006.01)
*B25B 11/00* (2006.01)

(52) U.S. Cl. ...................... 438/106; 438/758; 414/806; 414/935; 269/21; 257/E21.122

(58) Field of Classification Search ................ 438/106, 438/758; 414/755, 806, 935, 416.01, 757; 279/158; 250/559.4, 559.45; 396/611; 156/276, 156/344; 296/21; 257/E21.122
See application file for complete search history.

(56) References Cited

U.S. PATENT DOCUMENTS

| 4,391,511 | A  | * | 7/1983 | Akiyama et al. | .............. 355/40 |
| 4,897,171 | A  | * | 1/1990 | Ohmi | ..................... 204/298.15 |
| 5,759,006 | A  | * | 6/1998 | Miyamoto et al. | ...... 414/416.01 |
| 5,861,632 | A  | * | 1/1999 | Rohner | ................... 250/492.21 |
| 6,235,144 | B1 | * | 5/2001 | Yamamoto et al. | .......... 156/344 |
| 6,431,769 | B1 | * | 8/2002 | Fukuda et al. | .............. 396/611 |
| 6,541,989 | B1 | * | 4/2003 | Norris et al. | ................ 324/755 |
| 6,580,087 | B1 | * | 6/2003 | Suzuki et al. | ............. 250/559.4 |
| 6,612,590 | B1 | * | 9/2003 | Coomer et al. | ............. 279/158 |
| 6,767,426 | B1 | * | 7/2004 | Yamamoto | ................... 156/270 |
| 2002/0182038 | A1 | * | 12/2002 | Takisawa et al. | ........... 414/271 |

FOREIGN PATENT DOCUMENTS

| JP | 407058191 A | * | 3/1995 |
| JP | 410154671 A | * | 6/1998 |
| JP | 2001284434 A | * | 10/2001 |

* cited by examiner

*Primary Examiner*—Michael Lebentritt
*Assistant Examiner*—Ron Pompey
(74) *Attorney, Agent, or Firm*—Rader, Fishman & Grauer

(57) ABSTRACT

A wafer formed thin through a back grinding process is placed on a support table included in an alignment stage. When a faulty suction is caused by a warp of the wafer, a surface of wafer is pressed by a pressing plate to be corrected and held by suction. The wafer held by suction is transported, along with the alignment stage, to a mount frame preparing unit at the next step. The wafer is received while being held by suction by a chuck table contacting the surface of wafer.

19 Claims, 11 Drawing Sheets

SEMICONDUCTOR WAFER TRANSPORT METHOD AND SEMICONDUCTOR WAFER TRANSPORT APPARATUS USING THE SAME

BACKGROUND OF THE INVENTION (1) Field of the Invention

This invention relates to a semiconductor wafer transport method and a semiconductor wafer transport apparatus using the same, and in particular to a technique for efficiently transporting semiconductor wafers formed thin.

(2) Description of the Related Art

Conventionally, semiconductor wafers to be processed are transported through different processing steps as follows.

Semiconductor wafers (hereinafter called "wafers" as appropriate) with patterns formed on front surfaces thereof have the back surfaces ground (back grinding). At this time, the wafers have protective tape applied to the front surfaces.

Each wafer, after the back grinding process, is transported as suction-supported at the back surface to each stage.

In the case of a semiconductor wafer mounting apparatus, for example, a wafer taken out of a cassette by a robot arm is placed on and suction-supported by an alignment stage. An aligning operation is performed for this wafer. The wafer removed from the alignment stage after the alignment is transported to a wafer mounting step, placed in the center of a ring-shaped frame and has the front surface sucked by vacuum. In this state, dicing tape is applied to the back surface to join the ring-shaped frame and wafer together.

In recent years, however, the semiconductor wafer has been tending toward reduced thickness to meet requirements for high density mounting. The semiconductor wafer formed thin presents the following inconveniences.

The wafer formed thin by back grinding has reduced rigidity due to a processing stress. This wafer becomes warped only by a slight stress applied to its surface from outside.

When the warped wafer is placed on an alignment stage, a faulty suction will occur in which only part of the wafer is sucked. The wafer remaining defectively sucked will be displaced during transport to a next processing step. In this state, the wafer cannot be placed accurately on a support table or the like for executing the next step.

SUMMARY OF THE INVENTION

This invention has been made having regard to the state of the art noted above, and its primary object is to provide a semiconductor wafer transport method and a semiconductor wafer transport apparatus using the same, for efficiently transporting semiconductor wafers formed thin.

The above object is fulfilled, according to this invention, by a semiconductor wafer transport method for transporting a semiconductor wafer, the method comprising a supporting step for supporting the semiconductor wafer in a planar state with a warp thereof corrected, and a transporting step for transporting the semiconductor wafer supported in the planar state.

With the semiconductor wafer transport method according to this invention, the semiconductor wafer is maintained in a planar state with a warp thereof corrected. Consequently, the semiconductor wafer may be transported reliably in the planar state.

Preferably, the supporting step is a step of pressing on a surface of the semiconductor wafer, and holding the semiconductor wafer in the planar state by suction.

The warp of the semiconductor wafer is corrected by pressing on a surface of the semiconductor wafer. Consequently, the semiconductor wafer may be transported as reliably held by suction.

Preferably, the wafer transport method further comprises an aligning step for aligning the semiconductor wafer with the warp corrected in the supporting step. In the aligning step, the semiconductor wafer may be aligned by an aligner, with the warp corrected by a pressure imparted by a pressing device.

The semiconductor wafer is aligned in a planar state with the warp corrected. For example, the semiconductor wafer is aligned by an aligner, with the warp corrected by a pressure imparted by a pressing device. Consequently, the aligner can align the semiconductor wafer in a state of reliably held by suction, and with the warp of the semiconductor wafer corrected. With no faulty suction by the aligner or undulation due to a warp, a false detection by a position sensor may be avoided to eliminate a lowering of positioning accuracy.

It is preferable that, in the aligning step, the semiconductor wafer is aligned by the aligner, with the warp corrected by the pressure imparted by the pressing device, and the pressing device releases the semiconductor wafer when the aligner holds the semiconductor wafer by suction.

Since the pressing device releases the semiconductor wafer when the aligner holds the semiconductor wafer by suction, the aligner can hold by suction align the semiconductor wafer in a planar state.

Preferably, the semiconductor wafer, while being maintained in the planar state with the warp corrected in the supporting step, has a surface thereof irradiated with ultraviolet radiation.

Since the semiconductor wafer is maintained in the planar state with the warp corrected, its surface may be irradiated uniformly with ultraviolet radiation. Consequently, where a protective tape of the ultraviolet curable type is applied to the surface of the semiconductor wafer, the adhesive of the protective tape may be cured substantially uniformly.

The wafer transport method according to the invention, preferably, further comprises a receiving step for causing an individual holding device to contact the semiconductor wafer transported in the planar state, and receiving the semiconductor wafer held by this holding device by suction.

The semiconductor wafer maintained in the planar state is received by the individual holding device holding the semiconductor wafer by suction. That is, the holding device can receive the semiconductor wafer in the planar state with the warp thereof corrected.

Preferably, the semiconductor wafer maintained in the planar state is transported by moving the aligner.

Since the semiconductor wafer is transported along with the aligner aligning and holding the semiconductor wafer by suction, a displacement of the semiconductor wafer is avoided while maintaining a distortion of the semiconductor wafer corrected during transport.

The semiconductor wafer transport method may further comprise a step of pressing, with a pressing device, the semiconductor wafer held by a robot arm, and sucking, receiving and transporting the semiconductor wafer in a warp corrected state. Preferably, the semiconductor wafer transported by the robot arm is received by the pressing device, or the semiconductor wafer is received by the pressing device from the robot arm holding the semiconductor wafer in a cassette storing the semiconductor wafers in multiple stages.

Thus, the semiconductor wafer held by the robot arm is held by suction and supported in a state of the warp corrected by being pressed by the pressing device, i.e. in a planar state. For example, the semiconductor wafer transported by the robot arm may be received by the pressing device or the semiconductor wafer may be received by the pressing device from the robot arm holding the semiconductor wafer in a cassette storing the semiconductor wafers in multiple stages.

That is, the pressing device presses and holds the semiconductor wafer in a planar state by suction, thereby eliminating the faulty suction caused by the warp of the semiconductor wafer.

The aligner and the like can receive the semiconductor wafer in the planar state with the warp corrected, directly from the pressing device.

When placing the semiconductor wafer held by suction by the pressing device on the aligner, the semiconductor wafer is placed from above the aligner. After the placement, the pressing device may be retracted upward. This allows a determination, as desired, of a size and shape of a semiconductor wafer suction table of the aligner, and an arrangement of suction bores or grooves.

Conventionally, to place a semiconductor wafer held at the back surface thereof by suction by the robot arm on the suction table of the aligner, a cutout must be formed for allowing the robot arm to fit in the suction table and to cope with action after the placement of the semiconductor wafer. Since the semiconductor wafer is now held at the upper surface and in a planar state by suction to be placed on the suction table, such cutout need not be formed in the suction table as in conventional practice.

Further, since the semiconductor wafer is received in the planar state, there is less chance of damage to the semiconductor wafer than where only part of the plane of the semiconductor wafer is received.

Preferably, the semiconductor wafer transport method further comprises a step of transporting the semiconductor wafer as sandwiched between a robot arm for holding the semiconductor wafer and a pressing device for pressing the semiconductor wafer.

The robot arm and pressing device transport the semiconductor wafer as sandwiched therebetween. This is effective to correct the warp of the semiconductor wafer, and to avoid a fall or the like of the semiconductor wafer due to faulty suction.

Preferably, the transport method further comprises a step of transporting the semiconductor wafer as held by suction with the warp corrected by pressing the semiconductor wafer with a pressing device.

The semiconductor wafer may be transported as held by suction with the warp corrected by pressing the semiconductor wafer with the pressing device. For example, the semiconductor wafer may be transported between different processing apparatus by the pressing device alone. Thus, the semiconductor wafer may be transported without using a cassette or the like, and a robot arm need not be used.

Preferably, the semiconductor wafer is held by suction as pressed at least at peripheral portions and a central portion thereof.

By holding the semiconductor wafer by suction as pressed at peripheral portions and a central portion thereof, the semiconductor wafer, whether warped down or up, may be held in a planar state.

Preferably, the semiconductor wafer has a protective tape applied to a surface thereof beforehand.

Since a protective tape is applied to a surface of the semiconductor wafer beforehand, the surface may be handled with ease.

In another aspect of the invention, a semiconductor wafer transport apparatus is provided for transporting a semiconductor wafer, the apparatus comprising:

a support table for supporting and holding by suction the semiconductor wafer;

a pressing device for pressing on a surface of the semiconductor wafer supported on the support table; and a transporting device for transporting the semiconductor wafer pressed and held by suction by the support table.

With the semiconductor wafer transport apparatus according to the invention, the semiconductor wafer may be held by suction with the warp thereof corrected by the pressing device pressing on a surface of the semiconductor wafer supported on the support table. The semiconductor wafer is transported as held by suction by the support table. Consequently, the semiconductor wafer is always handled in a planar state, with the warp corrected, during transport of the semiconductor wafer. Thus, no displacement occurs during transport to realize a steady transportation.

Preferably, the semiconductor wafer transport apparatus further comprises a receiving device for contacting the semiconductor wafer transported by the transporting device, and receiving the semiconductor wafer while holding the semiconductor wafer by suction, or a detecting device for detecting a warp of the semiconductor wafer placed on the support table.

The receiving device contacts the semiconductor wafer transported in the planar state with the warp corrected. The receiving device receives the semiconductor wafer while holding the semiconductor wafer by suction. Consequently, the semiconductor wafer is always handled in the planar state, with the warp corrected, during transport of the semiconductor wafer. Thus, no displacement occurs during transport to realize a steady transportation.

Further, it is possible to detect a faulty suction due to the warp of the semiconductor wafer placed on the support table. Thus, once the faulty suction, the pressing device may be operated to apply a pressure to correct the warp into a planar state. Preferably, the transporting device is an aligner for aligning the semiconductor wafer.

The aligner having aligned the semiconductor wafer moves simply along with the semiconductor wafer. This is effective to avoid a displacement of the semiconductor wafer during transport.

Preferably, the pressing device is a suction device for holding the semiconductor wafer by suction.

The pressing device having suction bores can hold by suction and transport the semiconductor wafer in a planar state with the warp pressed and corrected. This is effective to avoid a fall or the like of the semiconductor wafer due to faulty suction. The semiconductor wafer, while being maintained in the planar state, may be transferred to the aligner or the like.

Preferably, the wafer transport apparatus according to this invention further comprises a robot arm for taking, or taking and transporting, the semiconductor wafer from a cassette storing semiconductor wafers in multiple stages, and a control device operable, when the semiconductor wafer is transferred from the pressing device to the aligner, for controlling release of the semiconductor wafer by the pressing device, and timing of the aligner holding the semiconductor wafer by suction.

With the robot arm provided, the semiconductor wafer may be taken from a cassette and directly transported, and the semiconductor wafer in the cassette may be held by the robot arm and the semiconductor wafer in this state may be received by the pressing device.

Further, release of the semiconductor wafer by the pressing device and timing of the aligner holding the semiconductor wafer by suction are controlled when the semiconductor wafer is transferred from the pressing device to the aligner. That is, by canceling the suction holding by the pressing device at a point of time when the aligner fully holds the semiconductor wafer by suction, the aligner can receive the semiconductor wafer maintained in the planar state, to avoid faulty suction.

This specification discloses the following solutions also:

(1) A semiconductor wafer mounting apparatus for holding a semiconductor wafer in a ring-shaped frame by means of adhesive tape, the apparatus comprising:

a cassette storing the semiconductor wafers in multiple stages;

a robot arm for taking each semiconductor wafer out of the cassette and transporting the semiconductor wafer;

a support table for receiving the semiconductor wafer transported by the robot arm and holding the semiconductor wafer by suction;

a pressing device for pressing on a surface of the semiconductor wafer placed on the support table;

a transporting device for transporting the semiconductor wafer pressed and held by suction by the support table;

a receiving device for contacting the semiconductor wafer transported, and receiving the semiconductor wafer while sucking the semiconductor wafer;

a tape applying device for applying the adhesive tape and holding in the ring-shaped frame the semiconductor wafer held by suction by the receiving device;

a cutter mechanism for cutting the adhesive tape applied; and a tape collecting device for collecting unwanted adhesive tape after the cutting.

When, for example, a warped semiconductor wafer and a ring-shaped frame are formed integrally by means of adhesive tape, it may be impossible to apply the adhesive tape uniformly to the semiconductor wafer under the influence of the warp. In the invention (1) above, the semiconductor wafer taken out of the cassette, after the warp is corrected by the support table, maintains the state of the warp corrected, until being held in the ring-shaped frame by means of the adhesive tape. Consequently, the semiconductor wafer, with the adhesive tape uniformly applied thereto, may be integrated with the ring-shaped frame.

(2) A semiconductor wafer suction holding method for holding a semiconductor wafer by suction, the method comprising:

a placing step for placing the semiconductor wafer on a support table for holding the semiconductor wafer by suction; and a pressing step for pressing on and correcting a warp of the semiconductor wafer placed.

When, for example, a warped semiconductor wafer is placed on the support table, it may be impossible to hold the semiconductor wafer reliably by suction under the influence of the warp. In the invention (2) above, the warp is corrected by pressing on the semiconductor wafer placed on the support table. Consequently, the semiconductor wafer, while being maintained in a planar state, may be held by suction reliably by the support frame.

(3) A semiconductor wafer suction holding apparatus for holding a semiconductor wafer by suction, the apparatus comprising:

a support table for receiving the semiconductor wafer and holding the semiconductor wafer by suction; and a pressing device for pressing on the semiconductor wafer placed.

When, for example, a warped semiconductor wafer is placed on the support table, it may be impossible to hold the semiconductor wafer reliably by suction under the influence of the warp. In the invention (3) above, the pressing device presses on the semiconductor wafer placed on the support table to correct the warp of the semiconductor wafer. Consequently, the semiconductor wafer in a planar state with the warp corrected may be held by suction reliably by the support frame.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

First Embodiment

An embodiment of this invention will be described hereinafter with reference to the drawings.

This embodiment will be described by taking, for example, a transport apparatus for transporting semiconductor wafers (hereinafter simply called "wafers W") in a semiconductor wafer mounting apparatus. It is assumed for this embodiment that an adhesive tape of the ultraviolet curable type is applied beforehand as protective tape to patterned surfaces (front surfaces) of wafers W.

Figure 1:
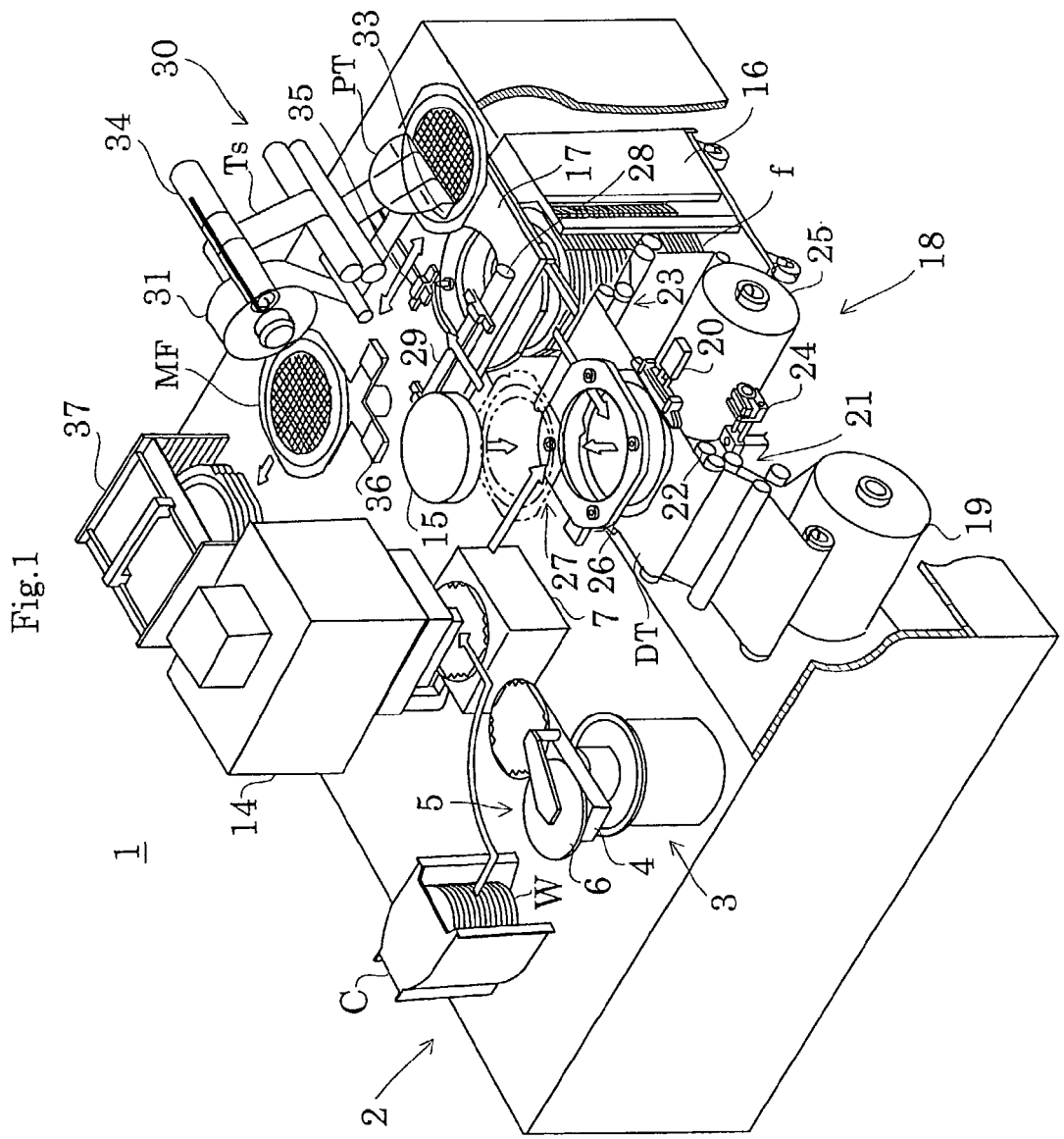
FIG. 1 is a cutaway perspective view showing an entire wafer mounting apparatus having a semiconductor wafer transport apparatus in the first and second embodiments.

FIG. 1 is a cutaway perspective view showing an entire semiconductor wafer mounting apparatus in one embodiment of this invention.

This semiconductor wafer mounting apparatus 1 includes a wafer supplying station 2 for receiving a cassette C storing, in multiple stages, wafers W having undergone a back grinding process, a wafer transport mechanism 3 having a robot arm 4 and a pressing mechanism 5, an alignment stage 7 for performing an aligning operation on each wafer W, an ultraviolet irradiating unit 14 for emitting ultraviolet radiation toward the wafer W placed on the alignment stage 7, a chuck table 15 for holding the wafer W by suction, a ring frame supplying unit 16 storing ring-shaped frames (hereinafter simply called "ring frames f") in multiple stages, a ring frame transport mechanism 17 for transferring each ring frame f to a dicing tape DT, a tape processor 18 for applying the dicing tape DT to the back surface of each ring frame f, a ring frame lift mechanism 26 for vertically moving the ring frame f with the dicing tape DT applied thereto, a mount frame preparing unit 27 for preparing a mount frame MF with the wafer W bonded integrally to the ring frame f having the dicing tape DT applied thereto, a first mount frame transport mechanism 29 for transporting the mount frame MF prepared, a separating mechanism 30 for separating the protective tape PT applied to the surface of wafer W, a second mount frame transport mechanism 35 for transporting the mount frame MF with the protective tape PT separated by the separating mechanism 30, a turntable 36 for turning and transporting the mount frame MF, and a mount frame collector 37 for storing mount frames MF in multiple stages.

The wafer supplying station 2 has a cassette table, and this cassette table receives the cassette C storing, in multiple stages, wafers W having undergone a back grinding process, and having the protective tape applied to patterned surfaces (hereinafter called "front surfaces" as appropriate) thereof. At this time, the wafers W are maintained in horizontal posture with the patterned surfaces facing up.

The wafer transport mechanism 3 is turned and vertically moved by a drive mechanism not shown. That is, a wafer holder of robot arm 4 and a pressing plate 6 of pressing mechanism 5 to be described hereinafter are positionally adjusted, and each wafer W is transported from the cassette C to the alignment stage 7.

The robot arm 4 of wafer transport mechanism 3 includes a horseshoe-shaped wafer holder, not shown, attached to a distal end thereof. The robot arm 4 is constructed to have the wafer holder movable into and out of spaces between the wafers W stored in multiple stages in the cassette C.

The wafer holder has suction bores for holding each wafer W at the back surface thereof by vacuum suction.

The pressing mechanism 5 of wafer transport mechanism 3 includes an arm portion having a circular pressing plate 6 attached to a distal end thereof and substantially corresponding in shape to the wafer W, the arm portion being movable to move the pressing plate 6 over the wafer W placed on the alignment stage 7. The shape of pressing plate 6 is not limited to circular, but may be any shape capable of correcting a warp of wafer W. For example, a tip end of a rod-like object may be pressed on a warped portion of wafer W. The pressing plate 6 corresponds to the pressing device of this invention.

Figure 2:
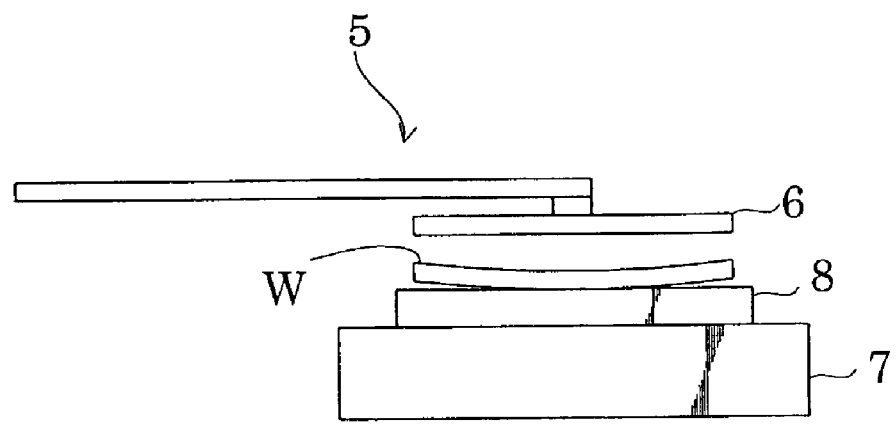
FIG. 2 is a view showing operation of a pressing mechanism in the first embodiment.
Figure 3:
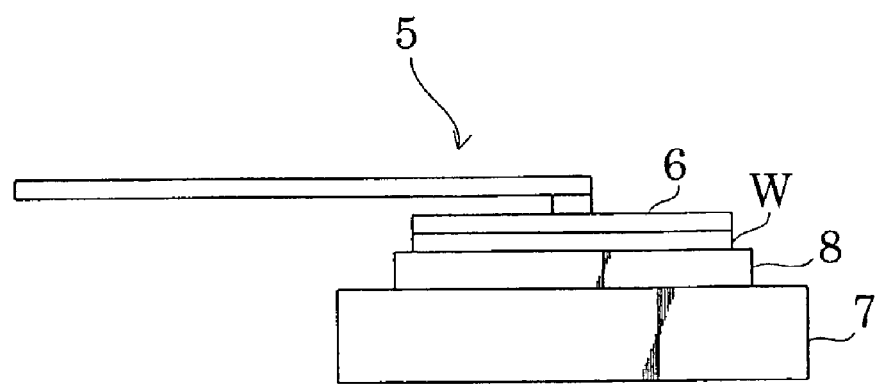
FIG. 3 is a view showing operation of the pressing mechanism in the first embodiment.

This pressing mechanism 5 is operable when a faulty suction occurs with the wafer W placed on a support table 8 of alignment stage 7 to be described hereinafter. Specifically, when, as shown in FIG. 2, the wafer W is warped so that the wafer W cannot be held by suction, as shown in FIG. 3, the pressing plate 6 presses the surface of wafer W to correct the warp into a planar state. In this state, the support table 8 holds the back surface of wafer W by vacuum suction.

Figure 4:
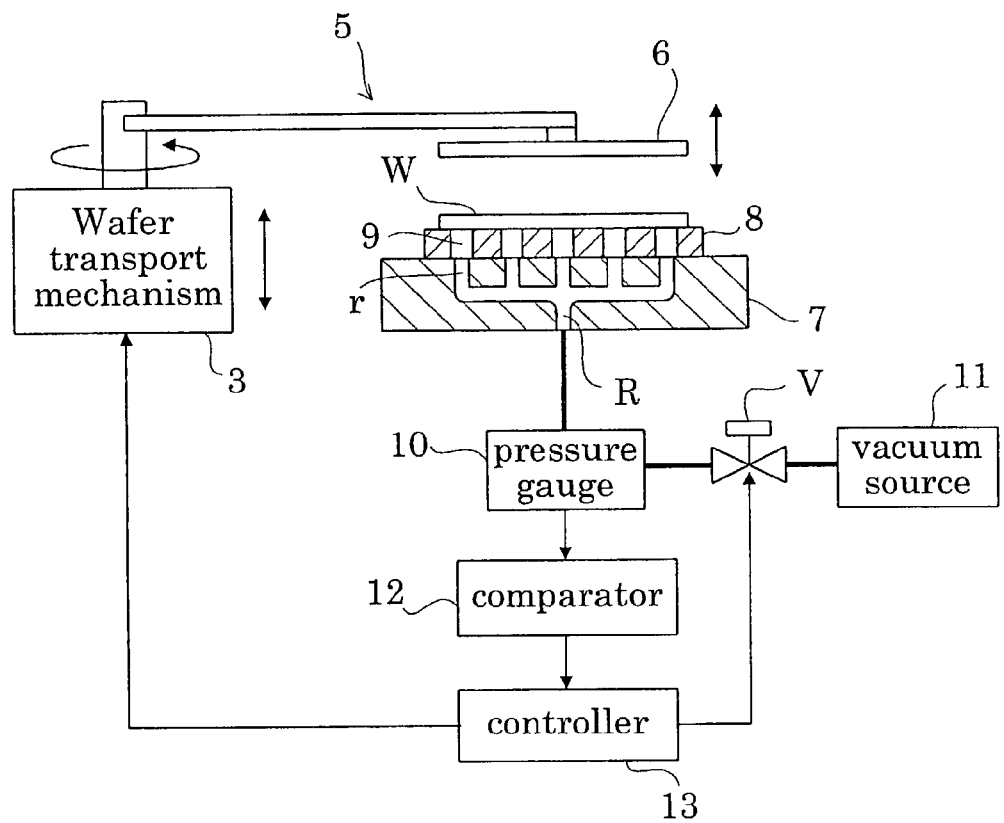
FIG. 4 is a block diagram showing principal portions of the pressing mechanism and an alignment stage in the first embodiment.

The alignment stage 7 has the support table 8 for performing an aligning operation on the wafer W based on an orientation flat, for example, and covering and holding by suction the entire back surface of wafer W. As shown in FIG. 4, this support table 8 has a plurality of suction bores 9 formed therein. The respective suction bores 9 communicate with suction paths r which are integrated in upstream positions into one suction pipe R. The integrated suction pipe R has a pressure gauge 10, a valve V and a vacuum source 11 arranged in the state order thereon.

The pressure gauge 10 has a comparator 12 connected thereto for comparing a pressure in time of sucking the wafer W with a predetermined reference value. The comparator 12 is connected to a controller 13. When the comparator 12 detects an abnormal pressure variation, this controller 13, receives a detection signal from the comparator 12, and operates the wafer transport mechanism 3 and pressing mechanism 5. The pressure gauge 10 and comparator 12 constitute the detecting device of this invention.

Specifically, when holding by suction the wafer W placed on the support table 8 and the wafer W is free from a warp, the wafer W adheres tight to the support table 8. Consequently, the pressure in the suction pipe R is lowered by the action of vacuum source 11.

On the other hand, when the wafer W is warped, the wafer W is lifted from the support table 8. Then, the suction pipe R communicates with the atmosphere through the suction bores 9, and the pressure in the suction pipe R hardly decreases. That is, when the wafer W is placed on the support table 8, the pressure gauge 10 measures the pressure in the suction pipe R.

The comparator 12 compares a pressure measurement obtained from the pressure gauge 10 and a reference value determined beforehand in relation to a pressure value in time of normal operation (i.e. when the wafer W is normally sucked by the support table 8). When the pressure measurement is higher than the reference value (that is, the pressure in the suction pipe R is not lowered sufficiently), the wafer W is determined to have a warp and not sucked by the support table 8. The comparator 12 sends an abnormal detection signal to the controller 13.

When this abnormal detection signal is inputted, the controller 13 operates the wafer transport mechanism 3 and pressing mechanism 5 to move the pressing plate 6 over the wafer W as shown in FIG. 2 and lower it as shown in FIG.

3. As a result, the wafer W is pressed to have the warp corrected, whereby the wafer W is sucked by the support table 8.

Figure 5:
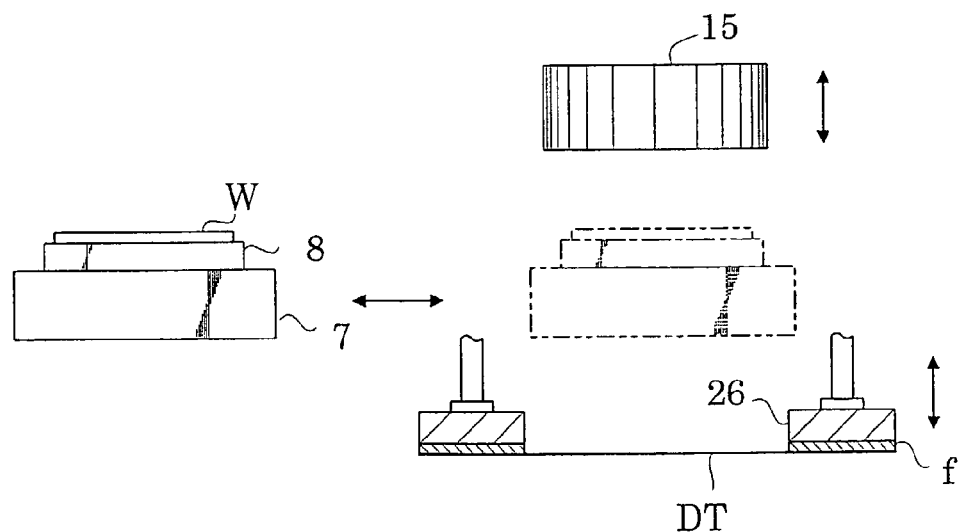
FIG. 5 is a view showing operation of the alignment stage in the first embodiment.

As shown in FIGS. 1 and 5, the alignment stage 7 is movable, transporting the wafer W as held by suction, between an initial position for supporting and aligning the wafer W, and a position between the chuck table 15 and ring frame lift mechanism 26 arranged in multiple stages above the tape processor 18 to be described hereinafter. That is, the alignment stage 7 transports the wafer W with a warp corrected and maintained in a planar state to the next step. The alignment stage 7 corresponds to the transporting device and the aligner of this invention.

The ultraviolet irradiating unit 14 is disposed above the alignment stage 7 in the initial position. The ultraviolet irradiating unit 14 emits ultraviolet radiation toward the protective tape PT which is an ultraviolet curable type adhesive tape applied to the surface of wafer W. That is, the adhesive strength of protective tape PT is reduced by the ultraviolet irradiation.

The chuck table 15 is circular which is approximately the same shape as the wafer W to cover and hold by vacuum suction the surface of wafer W, and is vertically movable by a drive mechanism not shown from a standby position above the tape processor 18 to a position for applying the wafer W to a ring frame f. The chuck table 15 corresponds to the individual holding device and the receiving device of this invention.

Figure 11:
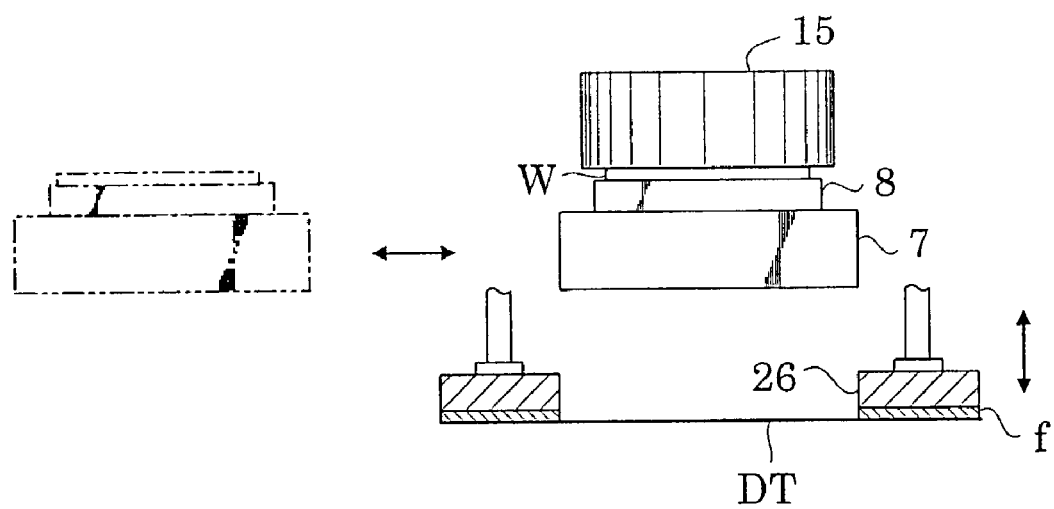
FIG. 11 is an explanatory view showing a wafer transport operation.

That is, as shown in FIG. 11, the chuck table 15 contacts and holds by suction the wafer W with a warp corrected and maintained in a planar state by the support table 8.

Figure 6:
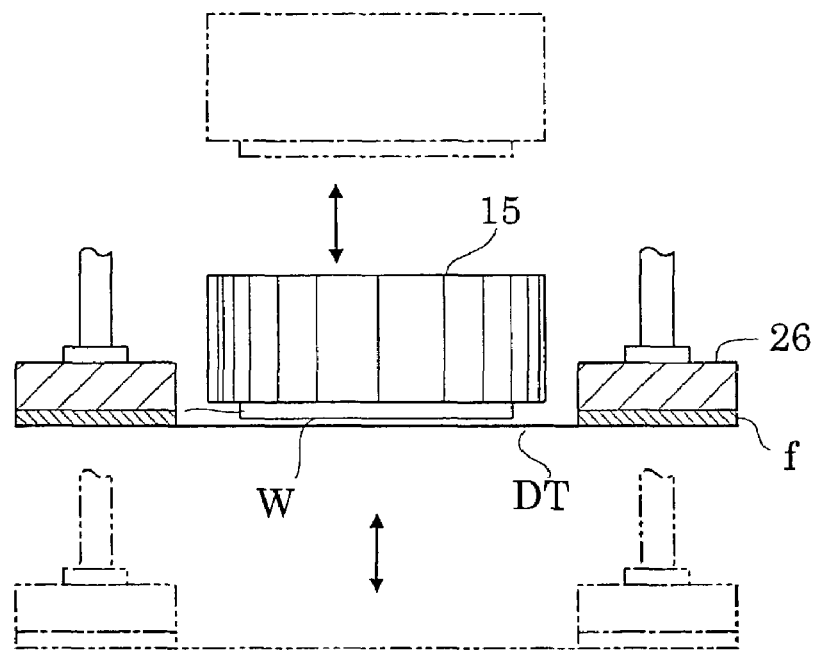
FIG. 6 is a view showing operation of a chuck table and a ring frame lift mechanism.

As shown in FIG. 6, the chuck table 15 is movable downward to a position inside an opening of the ring frame lift mechanism 26 holding by suction the ring frame f with the dicing tape DT, to be described hereinafter, applied to the back surface, and adjacent the dicing tape DT at the center of ring frame f.

At this time, the chuck table 15 and ring frame lift mechanism 26 are held by a holding mechanism not shown.

The ring frame supplying unit 16 has a wagon-like construction with a pulley disposed in a bottom position, and is fitted in a main body of the apparatus 1. The frame supplying unit is open at the top through which the ring frames f stored in multiple stages inside are slid upward and fed out.

The ring frame transport mechanism 17 sucks by vacuum an uppermost one and then a next one of the ring frames f stored in the ring frame supplying unit 16, and successively transports the ring frames f to an alignment stage not shown and to a position for applying the dicing tape DT. The ring frame transport mechanism 17 acts also as a holding mechanism, when applying the dicing tape DT, for holding the ring frames f in the position for applying the dicing tape DT.

The tape processor 18 includes a tape server 19 for supplying the dicing tape DT, a tension mechanism 20 for applying tension to the dicing tape DT, an applicator unit 21 for applying the dicing tape DT to the ring frames f, a cutter mechanism 24 for cutting the dancing tape DT applied to the ring frames f, a separator unit 23 for separating from the ring frames f unwanted tape cut by the cutter mechanism 24, and a tape collector 25 for collecting unwanted tape remaining after the cutting.

The tension mechanism 20 holds the dicing tape DT at opposite ends in the direction of width, and applies tension in the direction of width of the tape. That is, where soft dicing tape DT is used, a tension acting in a tape feeding direction results in longitudinal creases formed on the surface of dicing tape DT along the feeding direction. The tension is applied in the direction of width of the tape in order to avoid such creases and apply the dicing tape DT uniformly to the ring frames f.

Figure 7:
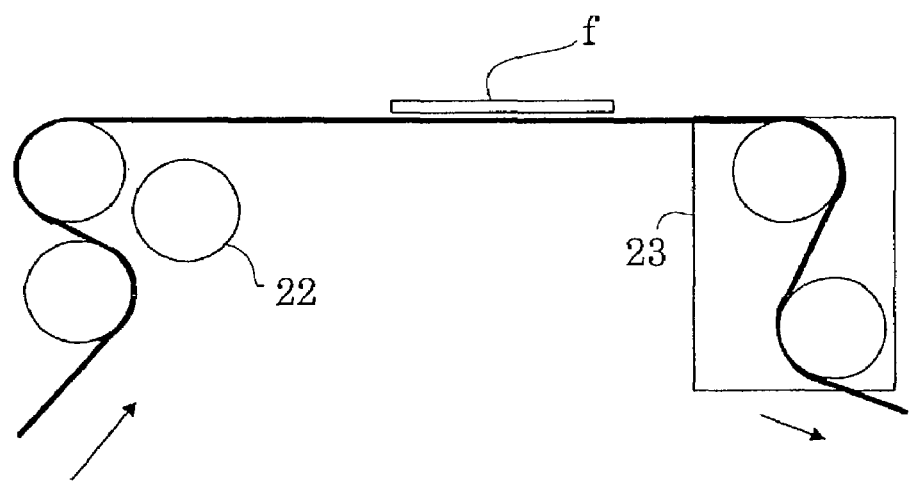
FIG. 7 is an explanatory view showing a dicing tape applying operation.
Figure 8:
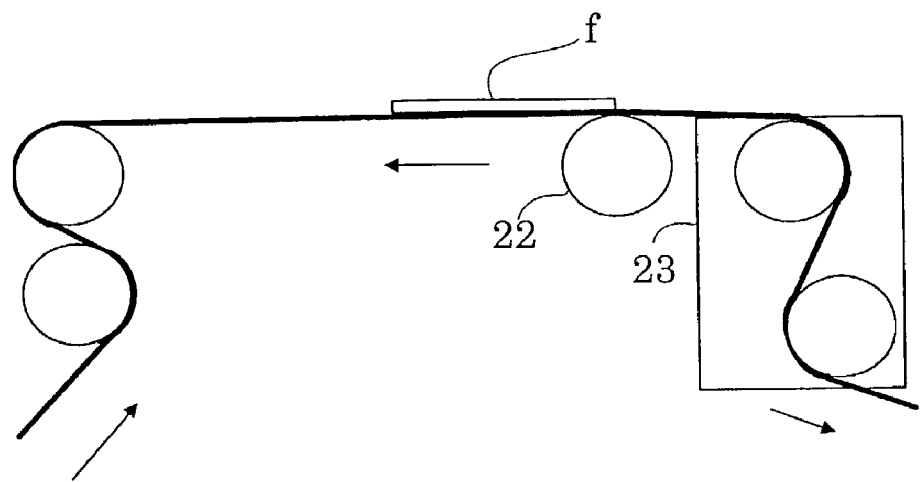
FIG. 8 is an explanatory view showing the dicing tape applying operation.

As shown in FIGS. 1 and 7, the applicator unit 21 is disposed in a standby position obliquely downward (leftward and downward in FIG. 1) of the ring frame f held above the dicing tape DT. The applicator unit 21 has an applicator roller 22 which moves to an application starting position rightward in the tape feeding direction shown in FIG. 8, at the same time as the ring frame transport mechanism 17 transports the ring frame f and holds it in the position for applying the dicing tape DT, and the tape server 19 starts feeding the dicing tape DT.

Figure 9:
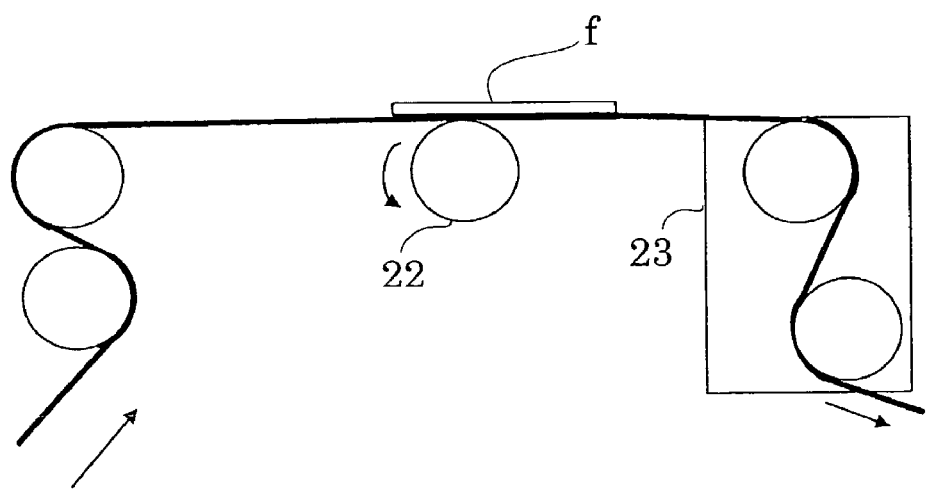
FIG. 9 is an explanatory view showing the dicing tape applying operation.

The applicator roller 22 having arrived at the application starting position moves upward to press and apply the dicing tape DT to the ring frame f and, as shown in FIG. 9, rolls from the application starting position toward a standby position while pressing and applying the dicing tape DT to the ring frame f.

Figure 10:
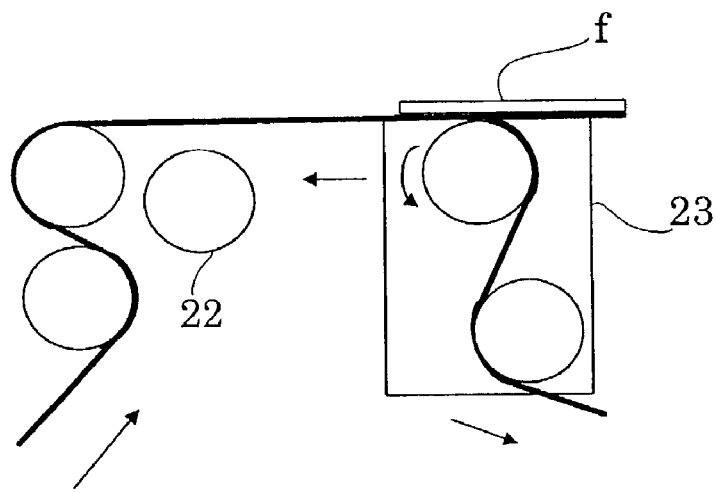
FIG. 10 is an explanatory view showing the dicing tape applying operation.

The separator unit 23 is constructed to separate from the ring frame f unwanted part of the dicing tape DT cut by the cutter mechanism 24 described hereinafter. Specifically, after the dicing tape DT is applied to the ring frame f and cut, the tension mechanism 20 releases the dicing tape DT. Next, as shown in FIG. 10, the separator unit 23 moves on the ring frame f toward the tape server 19 (leftward in FIG. 10) to separate unwanted dicing tape DT after the cutting operation.

As shown in FIG. 1, the cutter mechanism 24 is disposed below the dicing tape DT on which the ring frame f is placed. After the dicing tape DT is applied to the ring frame f by the applicator unit 21, the tension mechanism 20 releases the dicing tape DT and the cutter mechanism 24 moves upward. The cutter mechanism 24 having moved upward cuts the dicing tape DT along the ring frame f.

The ring frame lift mechanism 26 is in a standby position above the position for applying the dicing tape DT to the ring frame f. After the dicing tape DT is applied to the ring frame f, this ring frame lift mechanism 26 descends and holds the ring frame f by suction. At this time, the ring frame transport mechanism 18 which has been holding the ring frame f returns to an initial position above the ring frame supplying unit 16.

The ring frame lift mechanism 26 holding the ring frame f by suction ascends to a position for joining the wafer W. At this time, the chuck table 15 holding the wafer W by suction also descends to the position for joining the wafer W.

The mount frame preparing unit 27 includes an applicator roller 28. The applicator roller 28 is arranged to roll while pressing on a non-adhesive surface of the dicing tape DT applied to the back surface of ring frame f. The applicator roller 28 is formed of a soft material such as rubber or resin, for example.

The first mount frame transport mechanism 29 holds by suction the mount frame MF integrating the ring frame f and wafer W, and transfers it to a separating table, not shown, of the separating mechanism 30.

The separating mechanism 30 includes a separating table (not shown) for receiving and moving the wafer W, a tape server 31 for supplying separator tape Ts, a separator unit 32 for applying and separating the separator tape Ts, and a tape collector 34 for collecting separated separator tape Ts and protective tape PT. The construction of separating mechanism 30 except the separating table is arranged on an entire surface of a vertical wall, not shown, of the main body of the apparatus 1.

The tape server 31 supplies the separator tape Ts drawn from a stock roller to advance over the separating table.

The separator unit 32 has a separator plate 33. This separator plate 33 moves while pressing the surface of protective tape PT applied to the patterned surface of wafer W (wafer W applied to the mount frame MF by means of the dicing tape DT) transported by the separating table. At this time, the separator plate 33 applies the separator tape Ts to the protective tape PT while pressing on the non-adhesive surface of separator tape Ts, and separates the separator tape Ts and protective tape PT together. The separator tape Ts has a width smaller than the diameter of wafer W.

The second mount frame transport mechanism 35 holds by suction the mount frame MF discharged from the separating mechanism 30, and transfers it to the turntable 36.

The turntable 36 is constructed to perform an alignment of the mount frame MF and store it in the mount frame collector 37. That is, when the second mount frame transport mechanism 35 places the mount frame MF on the turntable 36, an aligning operation is carried out based on the orientation flat of wafer W and positioning profile of ring frame f. The turntable 36 is rotatable to change a direction for storing the mount frame MF in the mount frame collector 37. When a direction for storage is determined, the turntable 36 allows a pusher, not shown, to push out the mount frame MF whereby the mount frame MF is stored in the mount frame collector 37.

The mount frame collector 37 is placed on a vertically movable support table not shown. Thus, with vertical movement of the support table, the mount frame MF pushed out by the pusher may be stored in a selected stage of mount frame collector 37.

Figure 14:
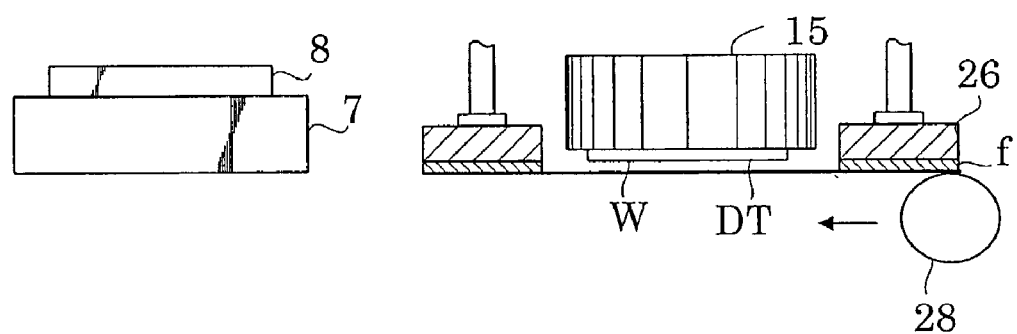
FIG. 14 is an explanatory view showing the wafer transport operation.
Figure 15:
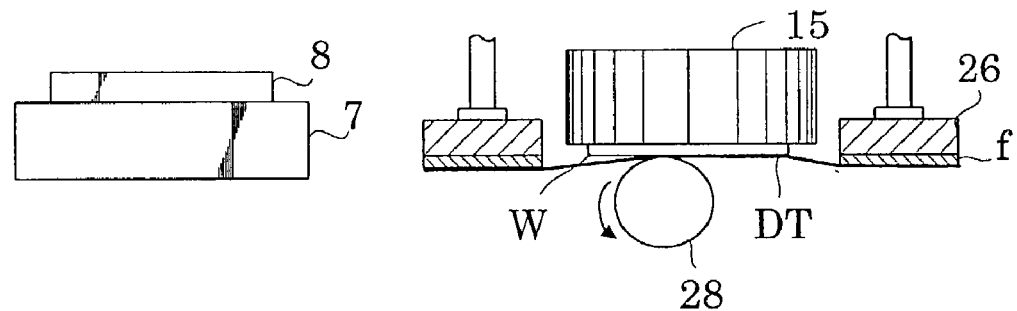
FIG. 15 is an explanatory view showing the wafer transport operation.
Figure 16:
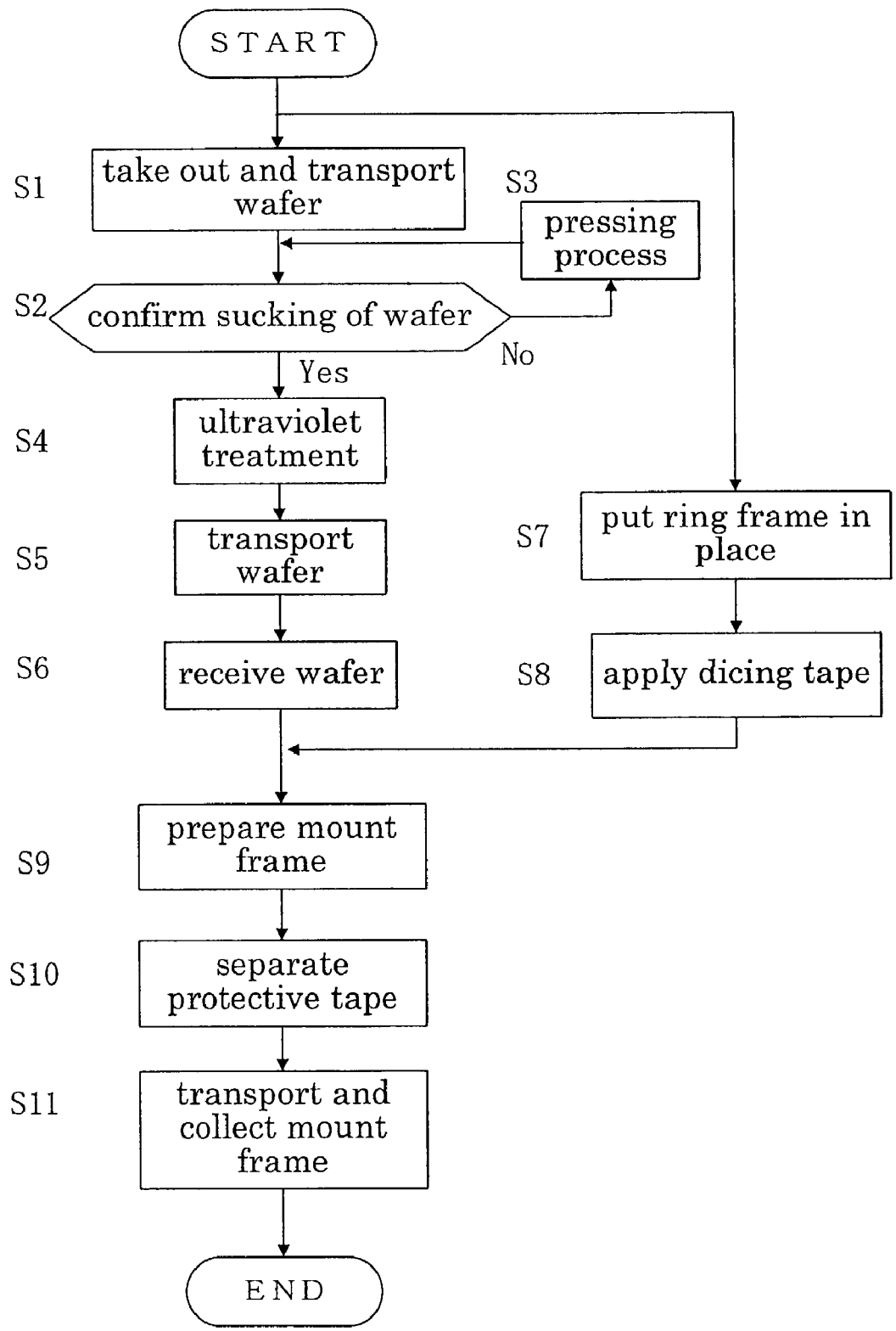
FIG. 16 is a flow chart illustrating operation of the apparatus in-the first embodiment.

Next, a cycle of operations of the above apparatus will be described with reference to the cutaway perspective view of FIG. 1, explanatory views of operations of the various mechanisms shown in FIGS. 2 and 3 and FIGS. 11 through 15, and flow chart shown in FIG. 16.

<Step S1> Take out and Transport Wafer

The wafer holder of robot arm 4 is inserted into a space in the cassette C. The wafers W are taken out, one at a time, as held at the lower surface by suction. Each wafer W taken out is transported to the alignment stage 7.

<Step S2> Confirm Sucking of Wafer

The robot arm 4 places the wafer W on the support table 8 to be held at the back surface by suction. At this time, the pressure gauge 10 detects a suction level of wafer W, and inputs a detection result to the comparator 12. The comparator 12 compares this detection result with the reference value determined beforehand in relation to a pressure value in time of normal operation. When the result of comparison shows that the pressure in the suction pipe R has lowered sufficiently, the suction of wafer W is determined to be excellent. At this time, an aligning operation is performed based on the orientation flat or notch, and the operation proceeds to step S4. Conversely, when the pressure measurement is higher than the reference value (that is, the pressure in suction pipe R is not lowered sufficiently), the wafer W is determined to have a warp and not sucked by the support table 8. Then, the operation proceeds to step S3.

<Step S3> Pressing Process

When an abnormal suction is detected, the controller 13 transmits signals to the wafer transport mechanism 3 and pressing mechanism 5 for operating each mechanism. That is, the wafer transport mechanism 3 rotates to direct the pressing plate 6 toward the support table 8 and extends the pressing plate 6 over the wafer W as shown in FIG. 2, by way of alignment for pressing the surface of wafer W. After the alignment, the wafer transport mechanism 3 descends to lower the pressing plate 6 to press upon the surface of wafer W as shown in FIG. 3. At the same time, the valve V is opened to have the wafer W held by suction in a planar state with the warp corrected. Further, the wafer W is aligned based on the orientation flat or notch.

After the warping of wafer W is corrected by pressurization, the operation returns to step S2 for a confirmation of the sucking of wafer W again.

<Step S4> Ultraviolet Treatment

After the alignment on the alignment stage 7, the ultraviolet irradiating unit 14 emits ultraviolet radiation to the surface of wafer W.

<Step S5> Transport Wafer

After the ultraviolet treatment, the wafer W is transported as held by suction by the support table 8, and along with the alignment stage 7, to the next mount frame preparing unit 27. That is, the alignment stage 7 moves to the position between the chuck table 15 and ring frame lift mechanism 26.

<Step S6> Receive Wafer

With the alignment stage 7 standing by in the predetermined position, as shown in FIG. 11, the chuck table 15 disposed above descends to have the bottom of chuck table 15 contact and begin sucking the wafer W by vacuum. When the chuck table 15 starts vacuum suction, the support table 8 stops its sucking action. Thus, the wafer W is received by the chuck table 15 in the planar state with the warp corrected.

Figure 12:
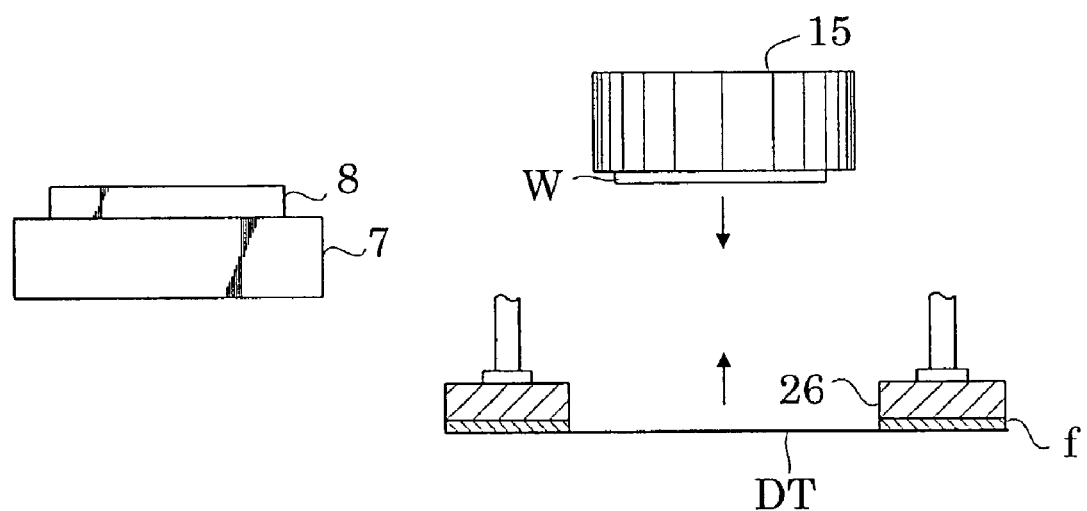
FIG. 12 is an explanatory view showing the wafer transport operation.

The alignment stage 7 having released the wafer W returns to the initial position as shown in FIG. 12.

<Step S7> Put Ring Frame in Place

The ring frame transport mechanism 17 sucks by vacuum and takes out an uppermost one and then a next one of the ring frames f stored in the ring frame supplying unit 16. Each ring frame f taken out is aligned on the alignment stage not shown, and then transported to the position, above the dicing tape DT, for applying the dicing tape DT.

<Step S8> Apply Dicing Tape

With the ring frame f held by the ring frame transport mechanism 17 and present in the position for applying the dicing tape DT, the tape server 19 starts feeding the dicing tape DT. At the same time, the applicator roller 22 moves to the application starting position.

Upon arrival of the applicator roller 22 at the applicator starting position, the tension mechanism 20 holds the dicing tape DT at opposite ends in the direction of width, and applies tension in the direction of width of the tape.

Next, the applicator roller 22 ascends, and presses to apply the dicing tape DT to an end of the ring frame f. After applying the dicing tape DT to the end of ring frame f, the applicator roller 22 rolls toward the standby position adjacent the tape server 19. At this time, the applicator roller 22 rolls while pressing the dicing tape DT (on the non-adhesive surface thereof), to apply the dicing tape DT to the ring frame f. When the applicator roller 22 reaches the terminal end of the applying position, the tension mechanism 20 releases the dicing tape DT.

At the same time, the cutter mechanism 24 ascends and cuts the dicing tape DT along the ring frame f. After the dicing tape DT is cut, the separator unit 23 moves toward the tape server 19 to separate unwanted dicing tape DT.

Next, the tape server 19 operates to draw out the dicing tape DT, and the cut, unwanted part of the tape is sent off to the tape collector 25. At this time, the applicator roller 22 moves to the application starting position to apply the dicing tape DT to a next ring frame f.

\<Step S9\> Prepare Mount Frame

Figure 13:
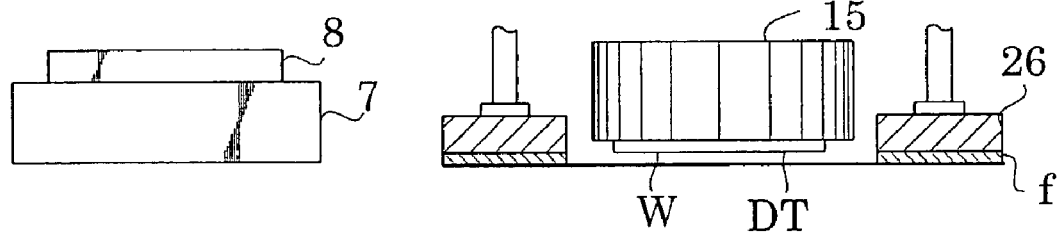
FIG. 13 is an explanatory view showing the wafer transport operation.

The ring frame f with the dicing tape DT applied thereto moves upward with the frame portion held by suction by the ring frame lift mechanism 26. At this time, the chuck table 15 also descends. That is, the chuck table 15 and ring frame lift mechanism 26 both move to the position for applying the wafer W. Specifically, as shown in FIG. 13, the bottom of chuck table 15 holding the wafer W by suction fits into the opening formed centrally of the ring frame lift mechanism 26. At this time, the wafer W lies adjacent the adhesive surface of dicing tape DT.

The respective mechanisms 15 and 26 having arrived at predetermined positions are held by the holding mechanism not shown. Next, as shown in FIG. 14, the applicator roller 28 moves to the position for starting application of the dicing tape DT and, as shown in FIG. 15, rolls while pressing on the non-adhesive surface of dicing tape DT applied to the bottom of ring frame f, to apply the dicing tape DT to the wafer W. As a result, a mount frame MF is prepared which integrates the ring frame f and wafer W.

When the mount frame MF has been prepared, the chuck table 15 and ring frame lift mechanism 26 move upward. At this time, the support table not shown moves under the mount frame MF, and the mount frame MF is placed on this support table. The mount frame MF placed is held by suction by the first mount frame transport mechanism 29 and transferred to the separating table not shown.

\<Step S10\> Separate Protective Tape The separating table on which the mount frame MF is placed moves toward a position under the separator unit 32. When the mount frame MF reaches the position under the separator unit 32, the separator plate 33 presses and applies the separator tape Ts fed from the tape server 31 to the protective tape PT on the surface of wafer W. The separator plate 33, while applying the separator tape Ts, separates the applied separator tape Ts along with the protective tape PT from the surface of wafer W.

The mount frame MF having undergone the process of separating the protective tape PT is moved by the separating table to the standby position of the second mount frame transport mechanism 35.

\<Step S11\> Transport and Collect Mount Frame

The mount frame MF discharged from the separating mechanism 30 is transferred to the turntable 36 by the second mount frame transport mechanism 35. The mount frame MF transferred is aligned by means of the orientation flat or notch, together with an adjustment of its direction of storage. When an alignment is done and a direction for storage is determined, the mount frame MF is pushed out by the pusher to be stored in the mount frame collector 37.

As described above, by correcting a warp of wafer W by operating the pressing plate 6, the wafer W may reliably be held by the support table 8 by suction. The wafer W is transported as held by suction by the support table 8, and along with the alignment stage 7, and the surface of wafer W is placed in contact with the suction surface of chuck table 15. In this state, the chuck table 15 sucks the wafer W by vacuum, and the support table 8 stops its sucking action. Thus, the wafer W is transported in a planar state with the warp corrected to a next step. As a result, the wafer W is transported reliably and free of displacement.

Second Embodiment

This embodiment is the same as the preceding first embodiment except that the pressing plate 6 of pressing mechanism 5 can hold by suction and transport each wafer W to the alignment stage 7. Like reference numerals are used to identify like parts which will not particularly be described.

Figure 17:
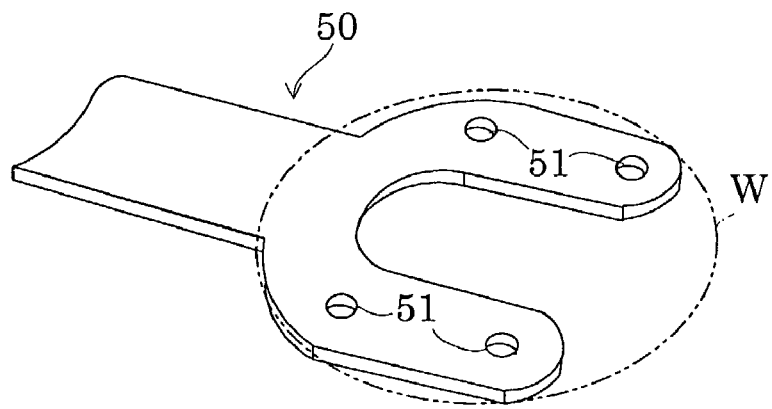
FIG. 17 is a perspective view of a wafer holder in the second embodiment.

As shown in FIG. 17, a wafer holder 50 is horseshoe-shaped, and includes two branched distal portions having suction bores 51 for holding by suction a wafer W at the back surface adjacent edges thereof.

The wafer holder 50 is not limited to the horseshoe shape, but may be ring-shaped or may be a flat plate substantially corresponding in shape to the wafer W, for example. Where the robot arm 4 does not take the wafer W out of the cassette C for transportation, the wafer holder 50 need not have the suction bores 51 for holding the wafer W by suction.

As does the robot arm 4, the pressing mechanism 5 has the pressing plate 6 constructed to be vertically movable and rotatable as well as movable into and out of a space between wafers W stored in multiple stages in the cassette C.

Figure 18:
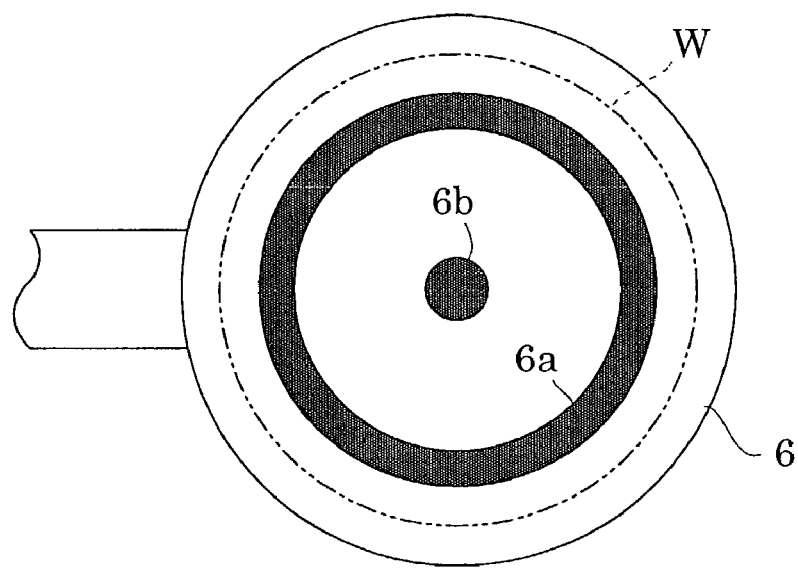
FIG. 18 is a view showing the back surface of a pressing plate in the second embodiment.
Figure 21:
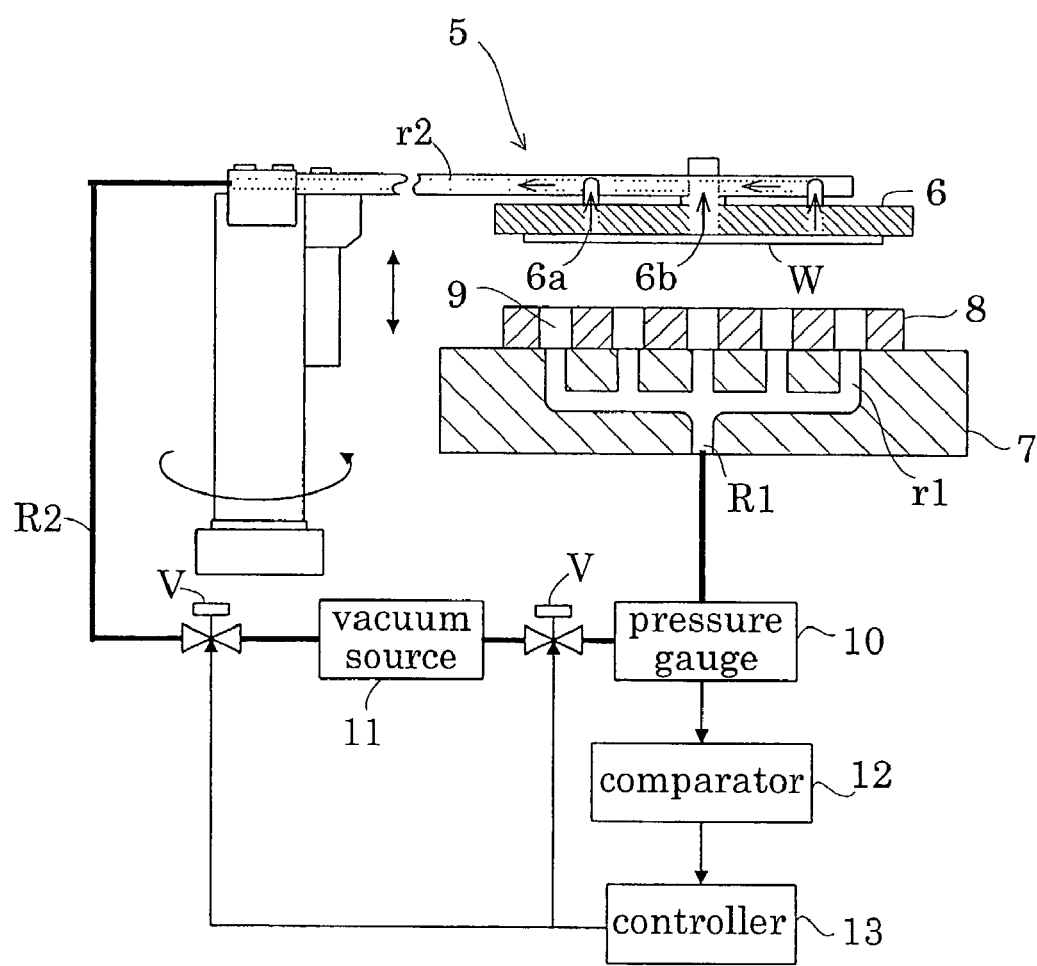
FIG. 21 is a block diagram showing principal portions of the pressing mechanism and alignment stage in the second embodiment.

The pressing plate 6 is capable of holding a wafer W by suction. As shown in FIG. 18, the pressing plate 6 is circular for covering the wafer W. Its surface for contacting the wafer W has an annular groove 6a for holding peripheral regions of wafer W by suction, and a suction bore 6b for holding a central portion of wafer W by suction. As shown in FIG. 21, the annular groove 6a and suction bore 6b are in communication with the vacuum source 11 through a suction path r2 inside the arm and a suction pipe R2.

The suction holding by the pressing plate 6 is not limited to this form, but may be any form only if capable of reliably holding the wafer W by suction. For example, a plurality of suction bores may be arranged equidistantly along the edge of pressing plate 6, or a plurality of suction bores may be arranged radially. The annular groove 6a and suction bore 6b correspond to the suction device of this invention.

Figure 20:
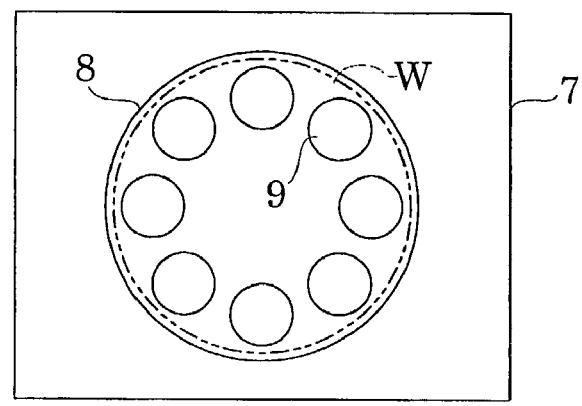
FIG. 20 is a plan view of an alignment stage in the second embodiment.

The alignment stage 7 has the support table 8 for performing an aligning operation on the wafer W based on an orientation flat, for example, and covering and holding by suction the entire back surface of wafer W. Specifically, as shown in FIG. 20, the support table 8 has a plurality of suction bores arranged equidistantly along the edge of support table 8 for holding peripheral portions of wafer W by suction.

As shown in FIG. 21, the respective suction bores 9 communicate with suction paths r which are integrated in upstream positions into one suction pipe R1. The integrated suction pipe R1 has a pressure gauge 10, a valve V and the vacuum source 11 arranged in the state order thereon.

The pressure gauge 10 has a comparator 12 connected thereto for comparing a pressure in time of sucking the wafer W with a predetermined reference value. The comparator 12 is connected to a controller 13. In response to pressure variations obtained from the comparator 12, the controller 13 adjusts the timing of opening and closing the valves V mounted on the suction pipes R1 and R2. The pressure gauge 10 and comparator 12 constitute the detecting device of this invention.

The comparator 12 shown in FIG. 21 compares a pressure measurement obtained from the pressure gauge 10 and a reference value determined beforehand in relation to a pressure value in time of normal operation (i.e. when the wafer W is normally sucked by the support table 8). When the pressure measurement is higher than the reference value (that is, the pressure in the suction pipe R1 is not lowered sufficiently), the wafer W placed by the pressing plate 6 is determined not being fully sucked by the support table 8.

Conversely, when the pressure measurement is lower than the reference value (that is, the pressure in suction pipe R is lowered), the comparator 12 sends to the controller 13 a normal detection signal indicating that the wafer W is sucked fully (normally).

When this normal detection signal is inputted to the controller 13 shown in FIG. 21, the valve V mounted on the suction pipe R2 is closed to releases the suction holding of wafer W. Thus, the alignment stage 7 can receive the wafer W in a planar state with the warp corrected from the pressing plate 6.

The pressure gauge 10 and comparator unit 12 constitute the detecting device of this invention.

Figure 19:
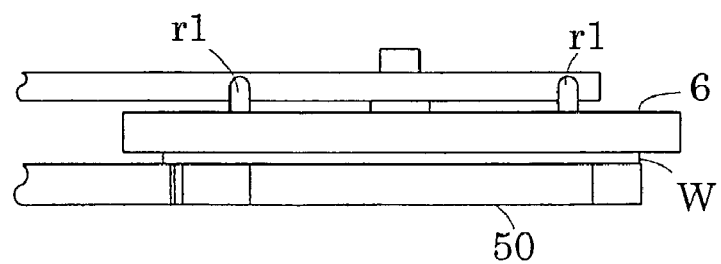
FIG. 19 is a side view showing a state of holding a wafer with the wafer holder and pressing plate.

Next, a cycle of operations of the apparatus in this embodiment will be described with reference to FIGS. 1, 19 and 21. In this embodiment, the operation of placing and aligning the wafer W on the alignment stage 7 and subsequent operations are the same as in the first embodiment, and will not particularly be described.

The wafer holder 50 of robot arm 4 is inserted into a space in the cassette C. A wafer W is held by suction from below.

Next, the pressing plate 6 of pressing mechanism 5 is inserted into a space in the cassette C, that is a space above the wafer W held by the wafer holder 50. The pressing plate 6 descends toward wafer W and, as shown in FIG. 19, holds the wafer W by suction while pressing it from above.

When the pressing plate 6 holds the wafer W by suction, the wafer holder 50 stops its sucking action. The pressing plate 6 takes the wafer W out of the cassette C while holding it by suction, and transports it to the alignment stage 7. At this time, the wafer holder 50 moves to a position for taking out a next wafer W.

While being pressed by the pressing plate 6, the wafer W is placed on the support table 8 of alignment stage 7. The support table 8 begins to suck the wafer W. At this time, a suction level of wafer W is successively detected by the pressure gauge 10, and a result of detection is inputted to the comparator 12.

The comparator 12 compares the detection result with the reference value determined beforehand in relation to a pressure value in time of normal operation. When the result of comparison shows that the pressure in the suction pipe R has lowered sufficiently, the suction of wafer W is determined to be excellent and a normal detection signal is sent to the controller 13.

Upon receipt of the normal detection signal, the controller 13 closes the valve V mounted on the pipe R2 and cancels the suction holding of the wafer W by the pressing plate 6. The pressing plate 6 moves to the cassette C to fetch a next wafer W, or returns to the standby position.

The alignment stage 7 aligns the wafer W held by suction, based on the orientation flat or notch. After the alignment, the ultraviolet irradiating unit 14 emits ultraviolet radiation to the surface of wafer W.

After the ultraviolet treatment, the wafer W is transported as held by suction by the support table 8, and along with the alignment stage 7, to the next mount frame preparing unit 27.

As described above, by taking out the wafer W in the cassette C and transporting the wafer W with a warp pressed and corrected by the pressing plate 6, falling of the wafer W due to faulty suction is avoided during transport to the alignment stage 7.

The support table 8 can receive the wafer W as maintained in a planar state by the pressing plate 6. Specifically, the pressing plate 6, while holding by suction and pressing the wafer W, places the wafer W on the support table 8. The support table 8 holds by suction the wafer W in the planar state with the warp corrected. The pressing plate 6 releases the wafer W at a point of time when the support table 8 fully (normally) holds the wafer W by suction. Thus, the support table 8 can reliably hold the wafer W, and the alignment stage 7 also can perform alignment accurately.

The wafer W is placed on the support table 8 while the pressing plate 6 holds the surface of wafer W by suction from above. Subsequently, the pressing plate 6 ascends to return or move to the standby position. It is therefore unnecessary to design the suction bores in the support table 8 by taking a retraction space for the wafer holder 50 into account as in the case of a conventional apparatus where the wafer W is placed on the support table 8 while the wafer holder 50 remains holding the lower surface of the wafer. That is, the support table 8 and alignment stage 7 may be varied in design for holding the wafer W by suction.

This invention is not limited to the foregoing embodiments, but may be modified as follows:

(1) The first embodiment has been described as using a pressing plate to correct a warp of wafer W. Instead, air or the like may be sprayed to the water to apply pressure thereto in a noncontact mode. That is, a noncontact pressure application is desirable where no protective tape is applied to the surface of wafer W.

(2) The first and second embodiments have been described in which an ultraviolet curable adhesive tape is used as protective tape. Where such ultraviolet curable adhesive tape is not used, the ultraviolet curing unit may be omitted.

(3) In the first and second embodiments, the mount frame MF discharged from the separating mechanism 30 is collected by the mount frame collector 37 immediately after correction of its position and direction. The following step may be additionally executed before the collection.

After recognizing a manufacturer's serial number printed on the wafer W, a label of a manufacturing control number in the form of a bar code may be printed out and applied to the wafer W.

(4) In the first and second embodiments, the pressing mechanism 5 is constructed as an integral part of the wafer transport mechanism 3. This construction is not limitative. The pressing mechanism 5 may be provided separately or may be integrated with the alignment stage.

(5) In the first and second embodiments described above, the pattern on the wafer is kept facing up when transported by the pressing plate. Instead, the back surface of the wafer may be kept facing up.

(6) In the second embodiment, the wafer W is transported from the cassette C to the alignment stage 7 by the pressing plate alone. Instead, the wafer holder 50 of robot arm 4 and the pressing plate 6 may transport the wafer W as sandwiched therebetween.

(7) In the second embodiment, the wafer W is taken out of the cassette C and transported to the alignment stage 7 by the pressing plate 6. Instead of using the cassette C, the pressing plate 6 may directly transport the wafer W, while pressing and holding it by suction; from an apparatus of the preceding step.

The pressing plate 6 may receive and hold by suction the wafer W taken out of the cassette C by the wafer holder 50, and transport the wafer W to the alignment stage 7.

Where the wafer W is held in the cassette C as pressed against bending, the wafer W may be pressed and held by suction by the pressing plate 6 alone without using the wafer holder 50.

(8) In the second embodiment, when the pressing plate 6 holds the wafer W in the cassette C by suction, a pressure gauge or the like may be used, as in the case of alignment stage 7, to determine whether the wafer W is held normally by the pressing plate 6.

This invention may be embodied in other specific forms without departing from the spirit or essential attributes thereof and, accordingly, reference should be made to the appended claims, rather than to the foregoing specification, as indicating the scope of the invention.

What is claimed is:

1. A semiconductor wafer transport method for transporting a semiconductor wafer having a first surface and a second surface opposite said first surface, said method comprising:
   a supporting step for placing said semiconductor wafer with said second surface contacting a holding device, and supporting, with said holding device, said semiconductor wafer in a planar state with a warp thereof corrected by a pressing device having a plate defining a flat pressing surface for pressing said semiconductor wafer, and said pressing device pressing said semiconductor wafer, with said plate and said first surface of said semiconductor wafer in surface-to-surface contact with each other, the flat pressing surface entirely covering said first surface of said semiconductor wafer; and
   a transporting step for transporting to each processing stage said semiconductor wafer supported in the planar state with the warp corrected in said supporting step.

2. A semiconductor wafer transport method as defined in claim 1, wherein said supporting step is a step of pressing on a surface of said semiconductor wafer, and holding said semiconductor wafer in the planar state by suction.

3. A semiconductor wafer transport method as defined in claim 1, further comprising an aligning step for aligning said semiconductor wafer with the warp corrected in said supporting step.

4. A semiconductor wafer transport method as defined in claim 3, wherein, in said aligning step, the semiconductor wafer is aligned by an aligner, with the warp corrected by a pressure imparted by a pressing device.

5. A semiconductor wafer transport method as defined in claim 4, wherein, in said aligning step, the semiconductor wafer is aligned by the aligner, with the warp corrected by the pressure imparted by the pressing device, and the pressing device releases the semiconductor wafer when the aligner holds the semiconductor wafer by suction.

6. A semiconductor wafer transport method as defined in claim 3, wherein the semiconductor wafer, while being maintained in the planar state with the warp corrected in said supporting step, has a surface thereof irradiated with ultraviolet radiation.

7. A semiconductor wafer transport method as defined in claim 1, further comprising a receiving step for causing an individual holding device to contact the semiconductor wafer transported in said planar state, and receiving the semiconductor wafer held by said holding device by suction.

8. A semiconductor wafer transport method as defined in claim 7, wherein the semiconductor wafer maintained in the planar state is transported by moving the aligner.

9. A semiconductor wafer transport method as defined in claim 1, further comprising a step of pressing, with a pressing device, the semiconductor wafer held by a robot arm, and sucking, receiving and transporting the semiconductor wafer in a warp-corrected state.

10. A semiconductor wafer transport method as defined in claim 9, wherein the semiconductor wafer transported by the said robot arm is received by the pressing device.

11. A semiconductor wafer transport method as defined in claim 9, wherein the semiconductor wafer is received by the pressing device from the robot arm holding the semiconductor wafer in a cassette storing said semiconductor wafers in multiple stages.

12. A semiconductor wafer transport method as defined in claim 1, further comprising a step of transporting said semiconductor wafer sandwiched between a robot arm for holding the semiconductor wafer and a pressing device for pressing the semiconductor wafer.

13. A semiconductor wafer transport method as defined in claim 1, further comprising a step of transporting the semiconductor wafer as held by suction with the warp corrected by pressing the semiconductor wafer with a pressing device.

14. A semiconductor wafer transport method as defined in claim 13, wherein said semiconductor wafer is transported between different processing apparatus as held by suction by the pressing device.

15. A semiconductor wafer transport method as defined in claim 1, wherein said semiconductor wafer is held by suction as pressed at least at peripheral portions and a central portion thereof.

16. A semiconductor wafer transport method as defined in claim 1, wherein said semiconductor wafer has a protective tape applied to a surface thereof beforehand.

17. A semiconductor wafer transport method for transporting a semiconductor wafer, said method comprising:
   a first supporting step for suction-supporting said semiconductor wafer in a planar state with a warp thereof corrected by pressing a holding device with a pressing device in surface contact with said semiconductor wafer, after said semiconductor wafer is thinned with a protective tape applied to a surface thereof and placed on an aligner;
   an ultraviolet irradiating step for emitting ultraviolet radiation to the protective tape on the surface of the semiconductor wafer suction-supported by said aligner
   a first transporting step for transporting said semiconductor wafer suction-supported by said aligner and irradiated with ultraviolet radiation;
   a second supporting step for suction-supporting said semiconductor wafer by placing a suction surface of a suction table in contact with a surface of said semiconductor wafer suction-supported by said aligner, and at the same time canceling the suction support by said aligner;
   a third transporting step for transporting said semiconductor wafer supported by said suction table to a position centrally of a ring frame having an adhesive tape applied thereto;
   a third supporting step for placing a back surface of said semiconductor wafer supported by said suction table close to an adhesive surface of said adhesive tape centrally of said ring frame, and attaching said semiconductor wafer to said ring frame while pressing and rolling an applicator roller on a non-adhesive surface of said adhesive tape;
   a fourth transporting step for canceling the suction support by said suction table from the surface of said semiconductor wafer attached to and held by said ring frame, and transporting said semiconductor wafer to a protective tape separating step;

a separating step for applying a separating tape to the protective tape on the surface of said semiconductor wafer attached to and held by said ring frame, while pressing a separating device on the surface of said semiconductor wafer attached to and held by said ring frame, and separating said separating tape, thereby separating the protective tape along with the separating tape from the surface of said semiconductor wafer; and a fifth transporting step for transporting said semiconductor wafer attached to and held by said ring frame, after the protective tape is separated from the surface of said semiconductor wafer.

18. A semiconductor wafer transport method as defined in claim 1, wherein said pressing plate is circular in configuration.

19. A semiconductor wafer transport method as defined in claim 18, wherein said pressing plate has a pressing plate diameter and said semiconductor wafer has a semiconductor wafer diameter, said pressing plate diameter and said semiconductor wafer diameter being at least substantially equal to each other.

* * * * *